United States Patent
Allegri

(10) Patent No.: US 8,393,753 B2
(45) Date of Patent: Mar. 12, 2013

(54) LED LIGHT PROJECTOR WITH A SINGLE REFLECTED BEAM

(75) Inventor: Fabio Allegri, Castel Goffredo (IT)

(73) Assignee: Coemar S.p.A., Castel Goffredo (IT)

( * ) Notice: Subject to any disclaimer, the term of this patent is extended or adjusted under 35 U.S.C. 154(b) by 201 days.

(21) Appl. No.: 12/900,963

(22) Filed: Oct. 8, 2010

(65) Prior Publication Data

US 2011/0235323 A1 Sep. 29, 2011

(30) Foreign Application Priority Data

Mar. 23, 2010 (IT) .................................. PR10A0021

(51) Int. Cl.
*F21V 1/00* (2006.01)

(52) U.S. Cl. ... 362/235; 362/224; 362/232; 362/249.02; 362/311.01; 362/311.02

(58) Field of Classification Search .......... 362/223–224, 362/230–232, 235, 238, 249.02, 311.01–311.02, 362/800

See application file for complete search history.

(56) References Cited

U.S. PATENT DOCUMENTS

| | | |
|---|---|---|
| 2005/0135106 A1 | 6/2005 | Kittelmann et al. |
| 2009/0103293 A1 | 4/2009 | Harbers et al. |
| 2009/0190347 A1 | 7/2009 | Lanz |
| 2009/0268455 A1 | 10/2009 | Allegri |
| 2010/0097802 A1 | 4/2010 | Jurik |
| 2010/0309646 A1 | 12/2010 | Morikawa et al. |

FOREIGN PATENT DOCUMENTS

| | | |
|---|---|---|
| DE | 10 2008 006 249 A1 | 7/2009 |
| EP | 1 548 356 A1 | 6/2005 |
| EP | 2119955 A1 | 11/2009 |
| EP | 2 177 816 A2 | 4/2010 |
| JP | 2005100723 A | 4/2005 |
| WO | 20081050783 A1 | 5/2008 |

*Primary Examiner* — Meghan Dunwiddie

(74) *Attorney, Agent, or Firm* — Pearne & Gordon LLP

(57) ABSTRACT

A LED light projector (1), comprising:
a plurality of LED light sources (3) capable of emitting a corresponding number of light beams (4);
a box-like body (7) housing within it the light sources (3) and having interior walls (7a) painted white to mix the light beams (4) in such a way as to emit a single output beam (14);
a frosted optical lens (8) located opposite the light sources (3);
at least one reflecting surface (2) set at a variable pre-established distance (d) from the optical element (8) so that the single beam (14) strikes the reflecting surface (2), giving rise by reflection to a homogeneous light cone (6).

10 Claims, 4 Drawing Sheets

LED LIGHT PROJECTOR WITH A SINGLE REFLECTED BEAM

The present invention relates to a LED light projector, in particular for use in the entertainment sector.

As is well known, numerous types of projectors using LED light sources already exist on the market. One of the most common solution entails electronic mixing (via software) of light beams originating from a plurality of white or different coloured LED light sources mounted on a support.

The main disadvantage of said solution resides in the fact that, even if the mixing is good and accurate, when looking frontally at the projector, the observer perceives a set of different coloured points, each corresponding to one of the sources which form the projector. Practically speaking, the lighting becomes homogeneous only at a certain distance from the projector, but there is an area, not negligible, within which one distinguishes the different coloured light beams that give rise to the final mixed beam.

There likewise exists the possibility of obtaining a better homogenization by arranging small groups of LED sources beneath a single lens or a single optical element (see patent application PR2008A000029 filed by the applicant). However, it is unthinkable to arrange all the LED sources of a large-sized projector beneath a single optical element. Therefore, in this case as well, there remains the problem of the dishomogeneity of the beam when viewed frontally.

Moreover, in order to reach high powers, many of these solutions prove to be extremely bulky.

A further disadvantage of the known solutions resides in the fact that in order to modify the aperture of the mixed cone it is necessary to use rather complex optical elements, without however solving the problem of the frontal perception of a plurality of beams.

In this context, the technical task at the basis of the present invention is to propose a LED light projector which overcomes the limitations of the above-mentioned prior art.

In particular, it is an object of the present invention to provide a LED light projector capable of uniformly mixing the light beams emitted by the individual LED sources so that an observer who is facing said projector perceives homogeneous lighting.

A further object of the present invention is to propose a LED light projector in which the aperture of the light cone emitted can be easily modified.

A further object of the present invention is to propose a LED light projector having reduced overall dimensions compared to prior art solutions.

The defined technical task and the specified objects hereof are substantially achieved by a LED light projector which comprises the technical characteristics described in one or more of the appended claims.

Further characteristics and advantages of the present invention will become more apparent from the following approximate, and hence non-restrictive, description of a preferred, but not exclusive, embodiment of a LED light projector, as illustrated in the appended drawings, in which.

Figure 1:
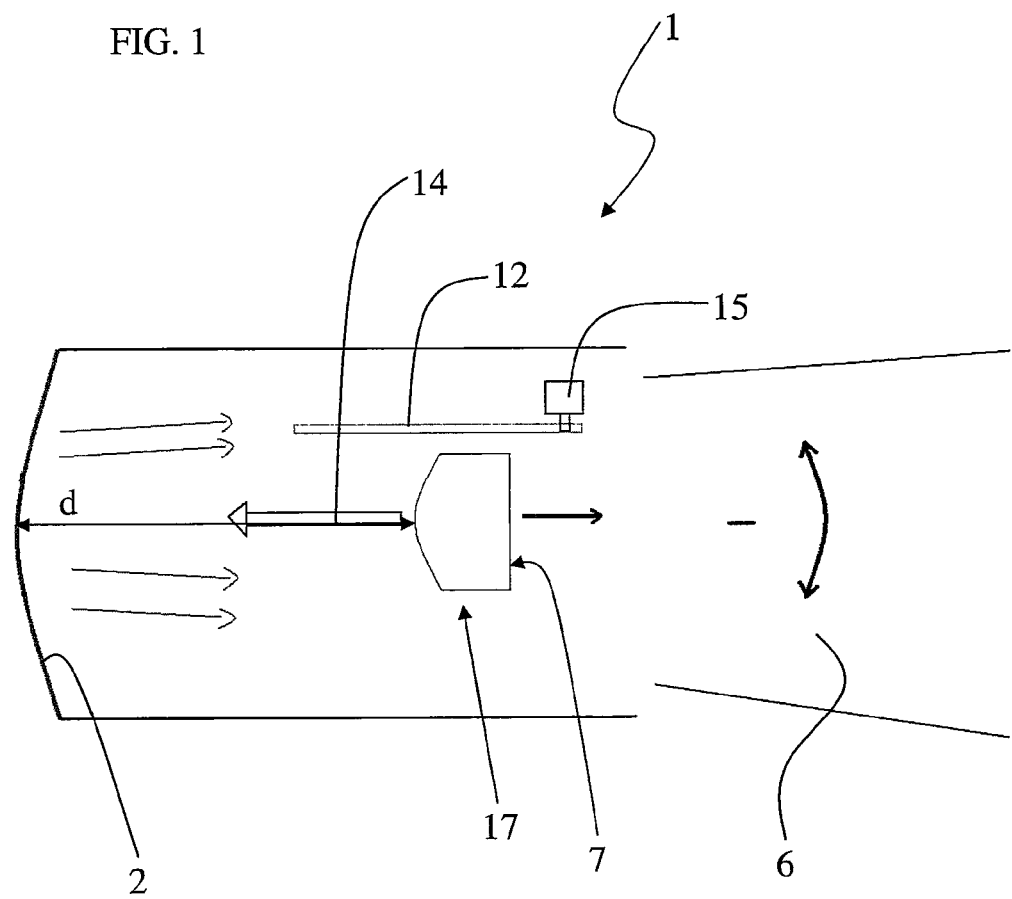
FIGS. 1 and 2 illustrate a simplified schematic view of a LED light projector.

With reference to the figures, 1 indicates a LED light projector, in particular to be used in the entertainment sector. The projector 1 comprises a plurality of LED light sources 3 capable of emitting a corresponding number of light beams 4. The projector 1 is moreover provided with means 17 for mixing the light beams 4 originating from the sources 3 in such a way as to obtain a single beam 14. Said means 17 comprise an optical element 8 located opposite said light sources 3. Preferably, the optical element 8 is an optical lens of the frosted type. A reflecting surface 2 is set at a pre-established distance d from the optical element 8 so that said single beam 14 strikes the reflecting surface 2, giving rise by reflection to a homogeneous light cone. Preferably, the reflecting surface 2 is parabolic or spherical. Said pre-established distance d is variable so as to modify the aperture of said light cone 6.

The projector 1 comprises a box-like body 7 housing within it the light sources 3. Advantageously, the box-like body 7 has interior walls 7a painted white which form part of the means 17 for mixing the light beams 4 issued by the sources 3. Preferably, said interior walls 7a are coated with compounds based on calcium carbonate or magnesium carbonate in order to achieve a high diffusion power.

Figure 3:
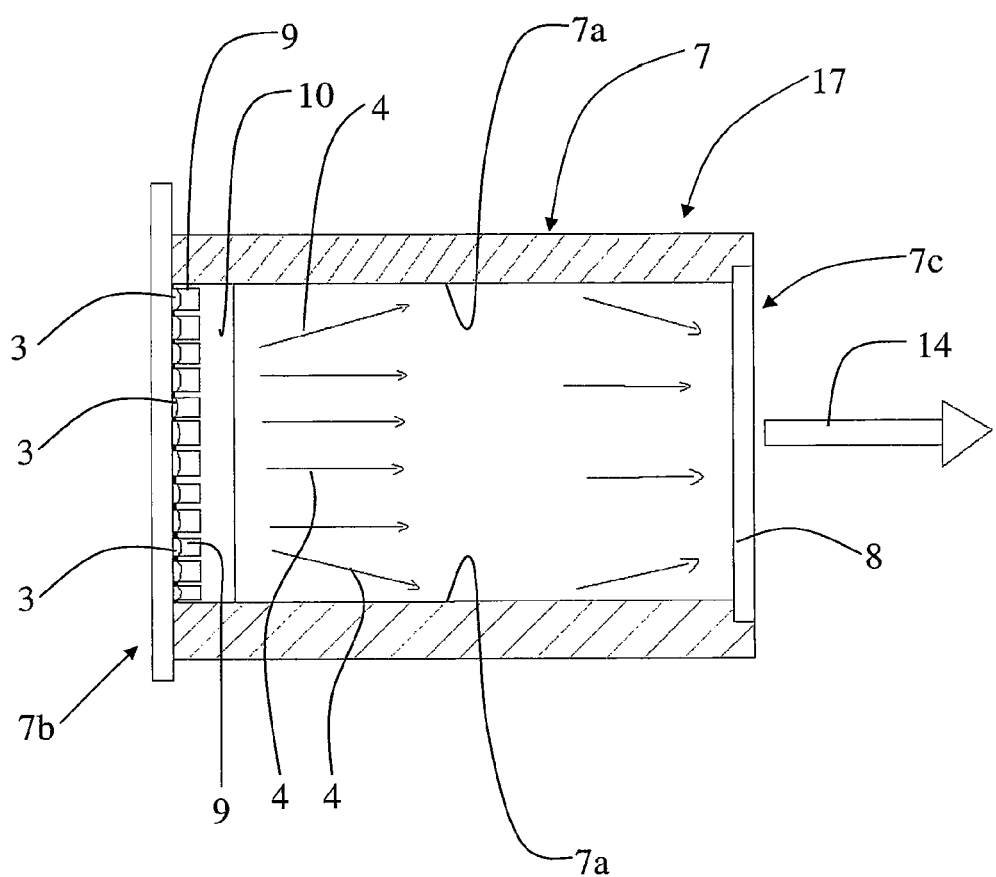
FIG. 3 illustrates a lateral cross-section view of a detail (box-like body) of the LED light projector, in a first embodiment.

In a first embodiment, illustrated in FIG. 3, the box-like body 7 substantially has the shape of a cylinder. The LED light sources 3 are mounted upon a first base 7b of said cylinder 7. The optical element 8 is disposed on a second base 7c of the cylinder 7, located opposite the reflecting surface 2. In the case of the cylindrical body 7, the interior walls 7a coincide with the interior lateral surface of the cylinder 7 itself.

Figure 4:
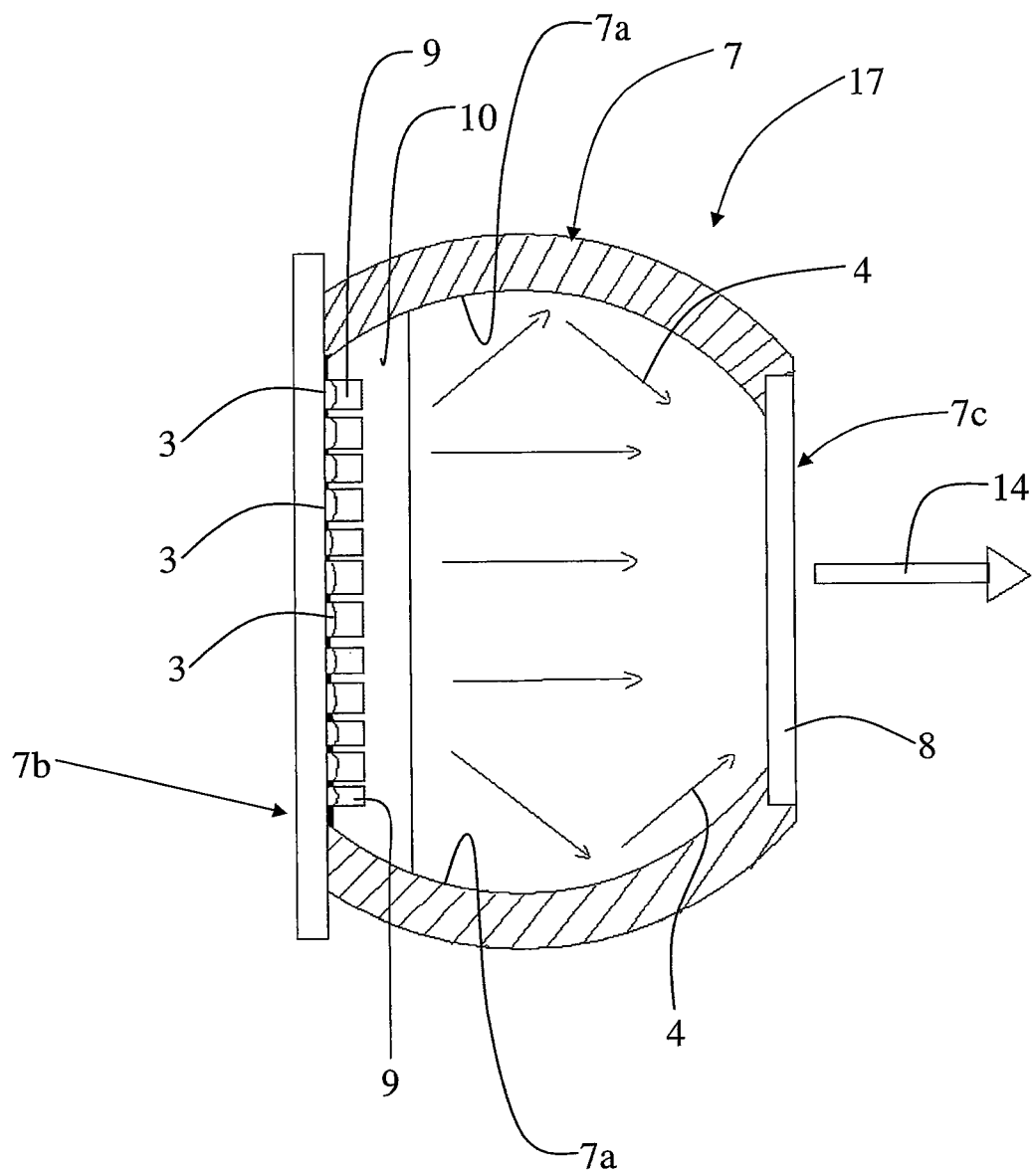
FIG. 4 illustrates a lateral cross-section view of the detail of FIG. 3, in a second embodiment.

In a second embodiment, illustrated in FIG. 4, the box-like body 7 has interior walls 7a that are outwardly rounded so as to favour the convergence of the light beams 4 issued by the sources 3 toward the optical element 8.

Within the meaning of the present description, the pre-established distance d is understood as the distance of the optical element 8 from the centre of curvature of the parabolic or spherical reflecting surface 2.

The light sources 3 are regularly disposed on the first base 7b in such a way as to form a circular light support having a diameter smaller than or equal to the height of the box-like body 7.

In the embodiments described and illustrated here, the projector 1 comprises a plurality of lenses 9, each of which is operatively active upon a corresponding LED light source 3 so as to influence the light beam 4 emitted.

Preferably, the LED light sources 3 and the lenses 9 are immersed in a layer 10 of resin.

Figure 2:
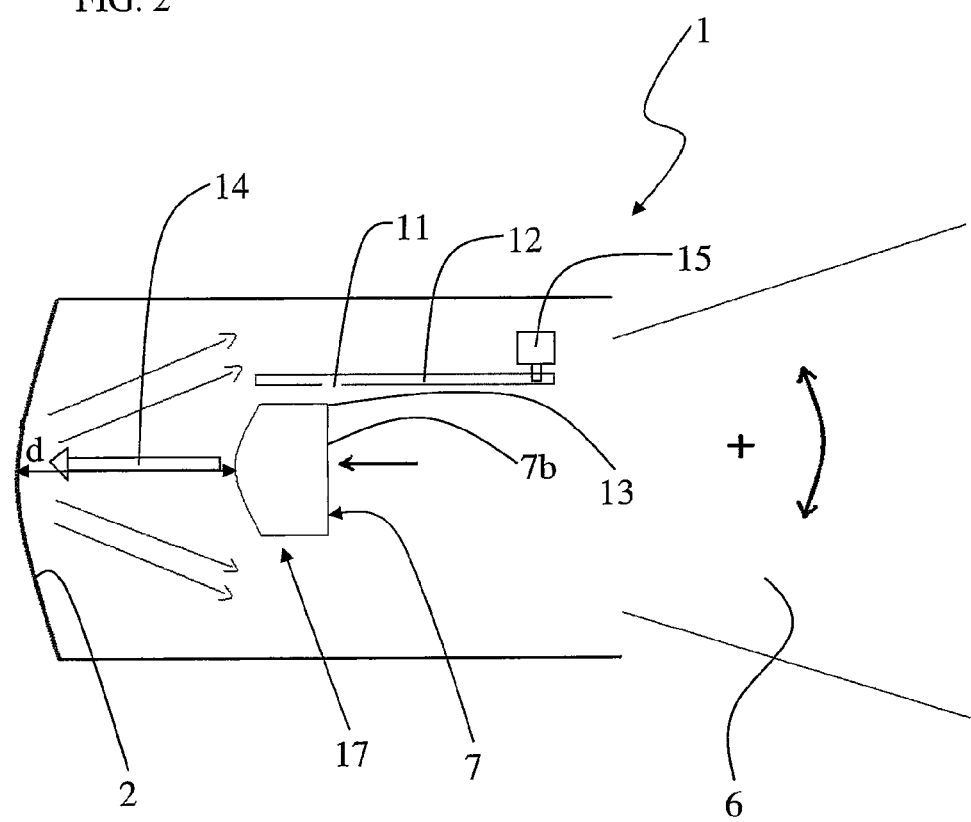

Preferably, the box-like body 7 is provided with a slide 11 designed to slide on a guide 12 extending substantially parallel to the optical axis of the reflecting surface 2. In particular, the slide 11 and guide 12 form means for varying the pre-established distance d. For example, as shown in FIGS. 1 and 2, the box-like body 7 is provided with a support 13, positioned on a first base thereof 7b, whereupon there is formed the slide 11 which slides on the guide 12. The sliding of the slide 11 along the guide 12 may be achieved manually or my means of a motor drive system. In FIGS. 1 and 2 there is schematically represented a motor 15 for driving the sliding movement of the slide 11 along the guide 12.

The functioning of the LED light projector is described hereunder.

The LED light sources 3 emit light beams 4 which are reflected by the white painted interior walls 7a of the box-like body 7 in such a way as to be mixed. In particular, the mixing of the light beams 4 emitted by the sources 3 is completed by their passage through the lenses 9, the layer 10 of resin and the frosted lens 8. From the box-like body 7a single beam 14, which on striking the reflecting surface 2 is reflected in several directions and generates the homogeneous light cone 6, is thus output. In order to increase the aperture of the light cone 6, the box-like body 7 is moved closer to the reflecting surface 2 by sliding the slide 11 along the guide 12. Conversely, in order to reduce the aperture of the light cone 6, the box-like body 7 is moved further away from the reflecting surface 2 by sliding the slide 11 along the guide 12.

The characteristics of the LED light projector according to the present invention are readily apparent from the description provided, as are the advantages thereof.

In particular, thanks to the use of the reflecting surface, it is possible to indirectly exploit the light emitted by the LED light sources, thereby obtaining uniform mixing of the mixed light beam originating from the box-like body. In fact, an observer who is directly facing the projector is not able to determine the type of light source, but rather perceives a homogeneous lighting. In particular, the light sources are not visible to the observer.

Moreover, thanks to the use of white coatings based on calcium carbonate or magnesium carbonate, which have a high diffusion power, it is possible to obtain optimal mixing of the light beams emitted by the sources.

Furthermore, contributing significantly to the uniformity of mixing is the structure of the box-like body, in which both the lenses and the layer of resin, as well as the frosted lens, complete the mixing already effected by the white painted interior walls. For example, the cylindrical embodiment makes it possible to have less dispersion of light, while the embodiment with outwardly rounded walls allows mixing to be further optimised.

Moreover, the aperture of the light cone generated by the projector can be modified in a simple manner by moving the cylindrical body housing the light sources closer to or further away from the reflecting surface.

Finally, the construction of a compact box-like body, able to mix the various beams in such a way as to obtain a single output beam, makes it possible to considerably reduce the dimensions compared to prior art projectors.

The invention claimed is:

1. A LED light projector, characterised in that it comprises:
    a plurality of LED light sources capable of emitting a corresponding number of light beams;
    means for mixing the light beams originating from the LED light sources in such a way as to obtain a single beam, said means comprising an optical element located opposite said light sources, said optical element being a frosted optical lens;
    a cylinder housing within it said light sources, said cylinder having interior walls painted white which form part of the means for mixing the light beams issued by the sources, said LED light sources being mounted upon a first base of the cylinder;
    at least one reflecting surface set at a pre-established distance from said optical element so that said single beam exiting from the cylinder strikes the reflecting surface, giving rise by reflection to a homogeneous light cone, said pre-established distance being variable so as to modify the aperture of said light cone, said optical element being disposed on a second base of the cylinder, located opposite the reflecting surface.

2. Projector according to claim 1, wherein said interior walls are coated with compounds based on calcium carbonate in order to achieve a high diffusion power.

3. Projector according to claim 1, wherein said interior walls are coated with compounds based on magnesium carbonate in order to achieve a high diffusion power.

4. Projector according to claim 1, wherein said cylinder has a first base, where said LED light sources are housed and a second base, located opposite the reflecting surface, where said optical element is disposed, said interior walls coinciding with the interior lateral surface of said cylinder.

5. Projector according to claim 1, wherein said cylinder has:
    a first base, where said LED light sources are housed;
    a second base, located opposite the reflecting surface, where said optical element is disposed;
    interior walls that are outwardly rounded so as to favour the convergence of the light beams issued by the sources toward the optical element.

6. Projector according to claim 4, wherein the light sources are regularly disposed on said first base in such a way as to form a circular light support having a diameter smaller than or equal to the height of said cylinder.

7. Projector according to claim 1, wherein said cylinder is provided with a slide designed to slide on a guide extending substantially parallel to the main optical axis of said reflecting surface, said slide and said guide forming means for varying said pre-established distance.

8. Projector according to claim 1, further comprising a layer of resin applied as covering for said LED light sources.

9. Projector according to claim 8, further comprising a plurality of lenses immersed in said layer of resin, each of said lenses being operatively active upon a corresponding LED light source so as to influence the light beam emitted.

10. Projector according to claim 1, wherein said reflecting surface is parabolic or spherical.

\* \* \* \* \*